United States Patent
Chang et al.

(10) Patent No.: US 8,329,533 B2
(45) Date of Patent: Dec. 11, 2012

(54) STACKED CAPACITOR FOR DOUBLE-POLY FLASH MEMORY

(75) Inventors: Julian Chang, Hsinchu (TW); An-Xing Shen, Hsinchu (TW); Soon-Won Kang, Hsinchu (TW)

(73) Assignee: Chingis Technology Corporation, Hsinchu (TW)

( * ) Notice: Subject to any disclaimer, the term of this patent is extended or adjusted under 35 U.S.C. 154(b) by 355 days.

(21) Appl. No.: 12/781,720

(22) Filed: May 17, 2010

(65) Prior Publication Data

US 2011/0278656 A1    Nov. 17, 2011

(51) Int. Cl.
*H01L 21/8242*    (2006.01)
(52) U.S. Cl. ......... 438/253; 438/238; 438/239; 438/244

(58) Field of Classification Search ............ 438/238, 438/239, 244, 253
See application file for complete search history.

(56) References Cited

U.S. PATENT DOCUMENTS

2010/0158072 A1*    6/2010    Fornara et al. ............ 374/152

* cited by examiner

*Primary Examiner* — Jae Lee
(74) *Attorney, Agent, or Firm* — CKC & Partners Co., Ltd.

(57) ABSTRACT

A stacked capacitor for double-poly flash memory is provided. The stacked capacitor is formed by a lower electrode, a lower dielectric layer, a central electrode, an upper dielectric layer, and an upper electrode, wherein the lower electrode is a doped region in a substrate. The manufacturing process of this stacked capacitor can be fully integrated in to the manufacturing process of the double-poly flash memory cell.

12 Claims, 5 Drawing Sheets

STACKED CAPACITOR FOR DOUBLE-POLY FLASH MEMORY

BACKGROUND

1. Technical Field

The disclosure relates to flash memory. More particularly, the disclosure relates to double-poly flash memory.

2. Description of Related Art

It is common in related art to form capacitors, in addition to resistors, transistors and diodes, in integrated circuits of various types. Capacitors formed within analog integrated circuit fabrications typically assure proper operation of those analog integrated circuits. Capacitors formed within digital integrated circuits typically provide charge storage locations for individual bits of digital data stored with those digital integrated circuits.

As is known in the art, the most important parameters involved in increasing the capacitance of a capacitor are increasing the area of the capacitor, and increasing the dielectric constant and decreasing the thickness of the insulator between the plates of the capacitor. However, with the ever-decreasing of feature sizes, including that of capacitor areas, the parameters that affect the capacitance of capacitors are requiring closer scrutiny in order to be able keep the unit capacitance values from being lowered further. That is, a solution must be found to meet the contradictory requirements for increasing the packing density of the integrated devices on the one hand, and increasing the storage capacity of the same, on the other.

SUMMARY

Accordingly, a stacked capacitor is provided for double-poly flash memory. The stacked capacitor comprises a lower electrode, a lower dielectric layer, a central electrode, an upper dielectric layer, and an upper electrode, wherein the lower electrode is a first doped region in a substrate.

The manufacturing process of this stacked capacitor can be fully integrated into the manufacturing process of the double-poly flash memory cell. The lower electrode is formed at the same step as a tunneling implant region of a flash cell is formed. The lower dielectric layer is formed at the same step as a tunneling oxide of the flash cell is formed. The central electrode is formed at the same step as a floating gate of the flash cell is formed. The upper dielectric layer is formed at the same step as a central dielectric layer of the flash cell is formed and covers a portion of the central electrode. The upper electrode is formed at the same step as a control gate of the flash cell is formed.

It is to be understood that both the foregoing general description and the following detailed description are by examples, and are intended to provide further explanation of the invention as claimed.

BRIEF DESCRIPTION OF THE DRAWINGS

FIGS. 2A-4A are cross-sectional diagrams of manufacturing process of the stacked-gate flash memory in FIG. 1A.

FIGS. 2B-4B are cross-sectional diagrams of manufacturing process of the stacked capacitor in FIG. 1B.

DETAILED DESCRIPTION

Figure 1A:
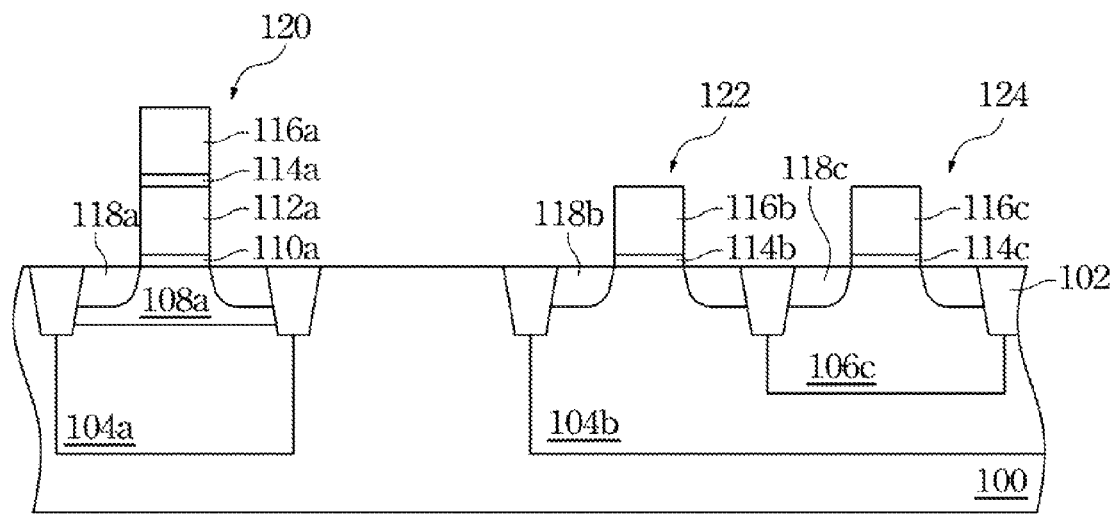
FIG. 1A is a cross-sectional diagram of a stacked-gate flash memory.

Accordingly, a stacked capacitor is provided for double-poly flash memory. The process of manufacturing the stacked capacitor can be easily integrated in the available process of manufacturing the double-poly flash memory. In the following detailed description, a process for manufacturing stacked-gate flash memory and the structure of the stacked-gate flash memory are provided by example. For purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
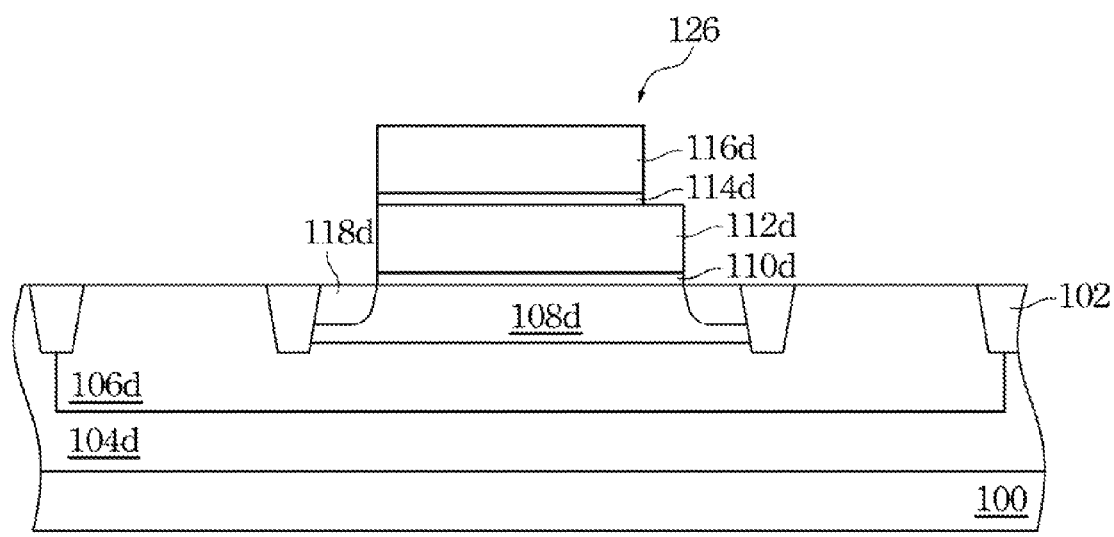
FIG. 1B is a cross-sectional diagram of a stacked capacitor of the stacked-gate flash memory in FIG. 1A according to an embodiment of this invention.
Figure 2A:
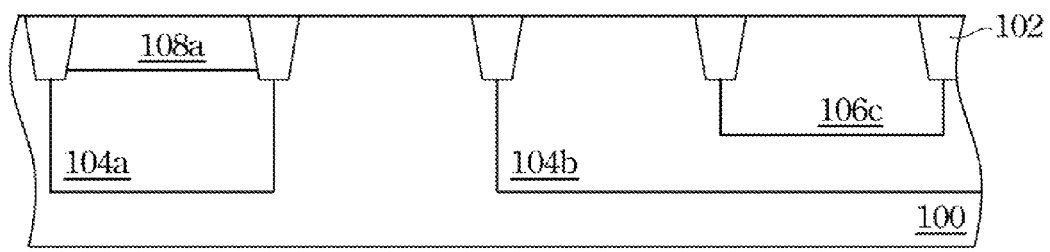
Figure 2B:
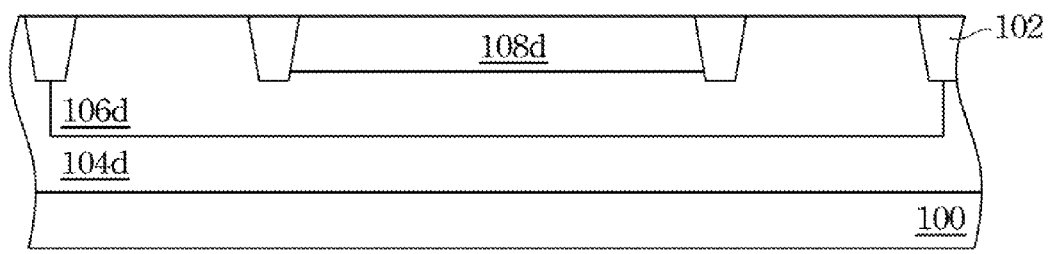

FIG. 1A is a cross-sectional diagram of a stacked-gate flash memory, and FIG. 1B is a cross-sectional diagram of a stacked capacitor of the stacked-gate flash memory in FIG. 1A according to an embodiment of this invention.

In FIG. 1A, a P-Flash cell 120, a PMOS 122, and a NMOS 124 are formed in a memory area and separated by isolation structure 102, such as shallow trench isolation or field oxide. The P-Flash cell 120 and the PMOS 122 are respectively formed in N-well 104a and 104b. The NMOS 124 is formed in the P-well 106c.

The P-Flash cell 120 is formed by a tunnel dielectric layer 110a, a floating gate 112a, a central dielectric layer 114a, a control gate 116a, and source/drain 118a, wherein the source/drain 118a is located in the N-type tunneling implant region 108a. The PMOS 122 is formed by a gate dielectric layer 110b, the gate 112b, and the source/drain 118b. The NMOS 124 is formed by a gate dielectric layer 110c, the gate 112c, and the source/drain 118c.

In FIG. 1B, a stacked capacitor 126 is formed in a peripheral area. The stacked capacitor 126 is formed by a lower electrode 108c (an N-type doped region), a lower dielectric layer 110c, a central electrode 102c, an upper dielectric layer 104c, and an upper electrode 106c. The central electrode 102c has a portion that is not covered by the upper dielectric layer 104a and the upper electrode 106a, and the exposed portion of the central electrode 102c is used to be electrically connected to a circuit node. The doped regions 118d are provided for the lower electrode 108d to be eclectically connected to other circuit nodes. The lower electrode 106d is located in a P-well 106d, and the P-well 106d is in an N-well 104d. Therefore, the lower electrode 108c, the lower dielectric layer 110c, and the central electrode 102c constitute a first capacitor. The central electrode 102c, the upper dielectric layer 104c, and the upper electrode 106c constitute a second capacitor.

Accordingly, in FIGS. 1A and 1B, the N-wells 104a, 104b, and 104d can be formed in the same step. The P-wells 106c and the 106d can be formed in the same step. The tunneling implant region 108a and the lower electrode 108d can be formed in the same step. The tunneling oxide 110a, and the lower dielectric layer 110d can be formed in the same step. The floating gate 112a, and the central electrode 112d can be formed in the same step. The central dielectric layer 114a, the gate oxide 114b, the gate oxide 114c, and the upper dielectric layer 114d can be formed in the same step. The control gate 116a, the gate 116b, the gate 116c, and the upper electrode 116d can be formed in the same step. The source/drain 118a and the source/drain 118b can be formed in the same step. The source/drain 118c and the doped regions 118d can be formed in the same step. That is, the manufacturing process of the stacked capacitor 126 in the peripheral area (FIG. 1B) can be completely integrated into the manufacturing process of the original P-Flash cell, PMOS, and NMOS in the memory area (FIG. 1A). No additional steps are needed to manufacture the stacked capacitor 126 in FIG. 1B. The more detailed manufacturing process is provided below by example.

FIGS. 2A-3A and FIGS. 2B-3B are cross-sectional diagrams of manufacturing process of the stacked-gate flash memory in FIG. 1A and the stacked capacitor in FIG. 1B, respectively.

Figure 3A:
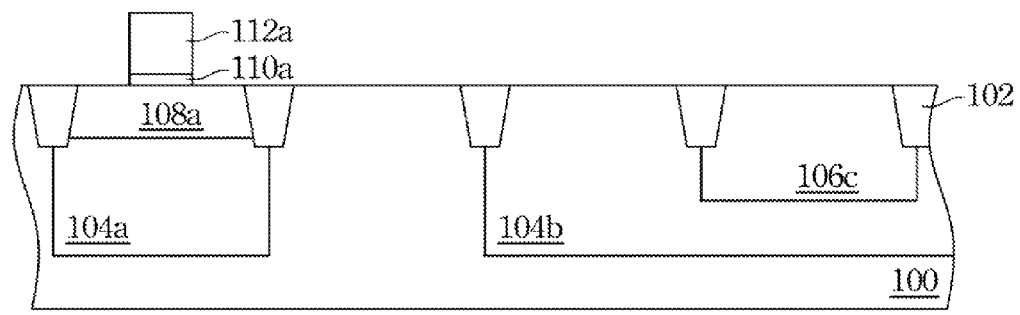
Figure 3B:
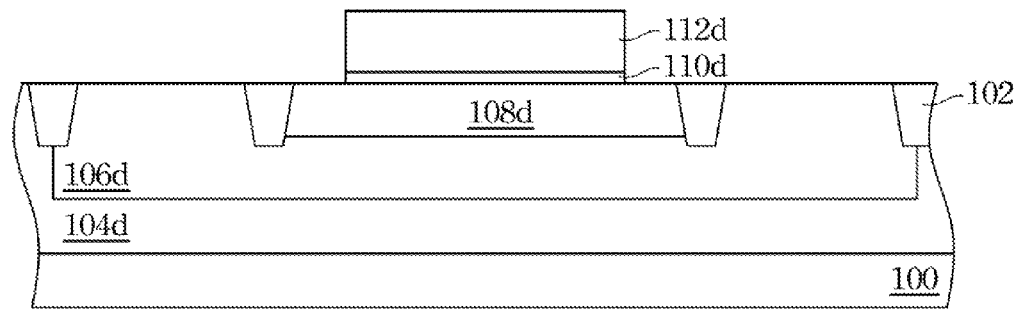

In FIGS. 3A and 3B, the isolation structures 102 are first formed in the substrate 100. Next, the N-wells 104a under the P-Flash cell 120, 104b under the PMOS 122, and 104d under the stacked capacitor 126 are formed in the substrate 100. The P-wells 106c and 106d are subsequently formed in the N-wells 104b and the N-well 104d, respectively. Then, the tunneling implant region 108a and the lower electrode 108d are respectively formed in the N-well 104a and the P-well 106d. The does, the kinetic energy, and the type of the implanted ions for all the above doped regions can be determined by any ones skilled in the art and hence are omitted here.

In FIGS. 3A and 3B, a first dielectric layer and a first conductive layer are sequentially formed on the substrate 100. Then, the first dielectric layer and the first conductive layer are patterned at the same time. The first dielectric layer is patterned to form the tunneling dielectric layer 110a and the lower dielectric layer 110d. The first conductive layer is patterned to form the floating layer 112a and the central electrode 112d. The first dielectric layer above can be a thermal oxide layer or other high-k dielectric layer, for example. The material of the first conductive layer can be polysilicon or other conductive material, for example. The patterning method above can be photolithography and etching processes.

Figure 4A:
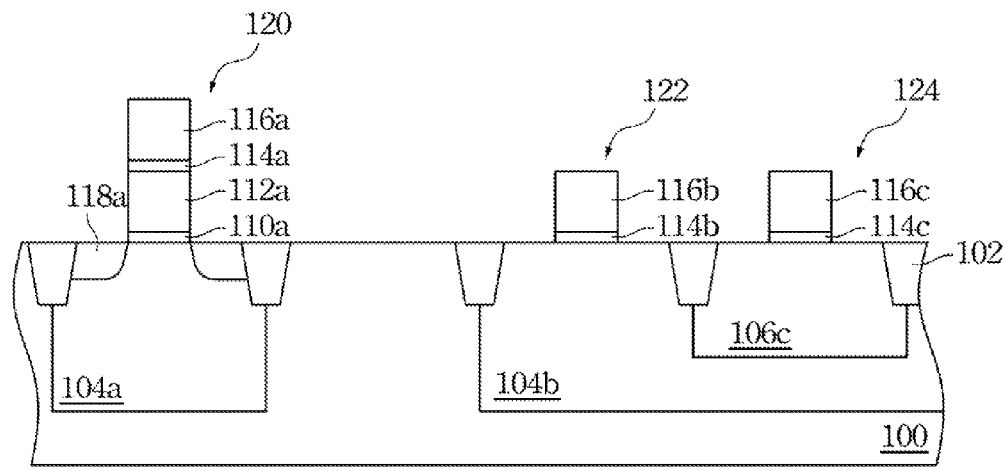
Figure 4B:
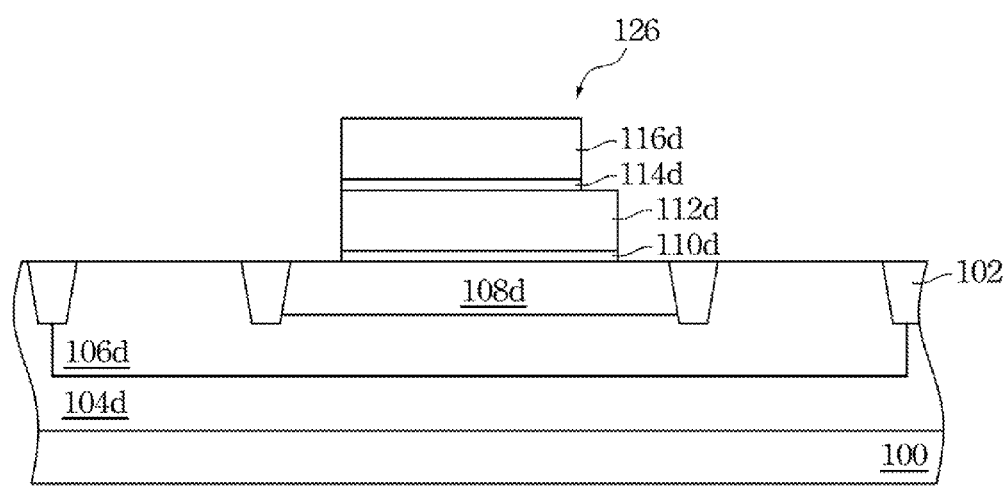

In FIGS. 4A and 4B, a second dielectric layer and a second conductive layer are sequentially formed on the substrate 100. The second dielectric layer and a second conductive layer are then patterned at the same time. The second dielectric layer is patterned to form the central dielectric layer 114a, the gate dielectric layer 114b and 114c, and the upper dielectric layer 114d. The second conductive layer is patterned to form the control gate 116a, the gate 116b and 116c, and the upper electrode 116d. The second dielectric layer can be oxide-nitride-oxide composite layer or other high-k dielectric layer, for example. The material of the second conductive layer can be polysilicon or other conductive material. The patterning method above can be photolithography and etching processes.

Next, source/drain 118a and the source/drain 118b are formed in the substrate 100 to obtain the P-Flash cell 120 and the PMOS 122, and the source/drain 118c and the doped regions 118d are then formed in the substrate 100 to obtain the NMOS 124 and the stacked capacitor 126. The sequences of performing the above two doping steps also can be switched. Typically, the doped concentration of the source/drain 118a, 118b, 118c, and the doped regions 118d is higher than the doped concentration of the tunneling implant region 108a and the lower electrode 108d.

Some electrical tests of a 0.18 μm stacked capacitor were done by computer simulations. For the rapid aging test, which was computer simulated under a bias of 12 V and at a temperature of 125° C., both of the first capacitor and the second capacitor in FIG. 1B could pass 10 years life time.

Figure 5:
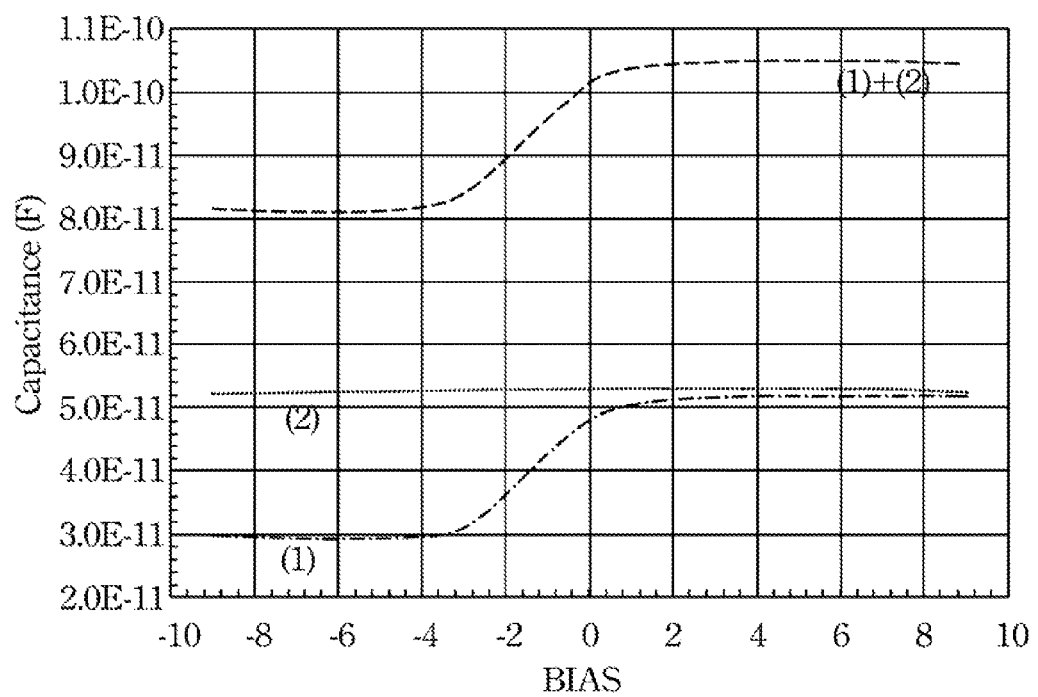
FIG. 5 is a diagram of C-V curve of the stacked capacitor in FIG. 1B simulated by computer.

For the C-V curve of the 0.18 μm stacked capacitor, the computer-simulated result is shown in FIG. 5. The test area of the stacked capacitor was 100×70 μm$^2$, and the test temperature was 25° C. In FIG. 5, the curve (1), (2), and (1)+(2) are the C-V curves of the first, the second and the stacked capacitors, respectively. The result shows that the capacitance of the first and the second capacitors are addable. That is, the capacitance of the stacked capacitor was the sum of the capacitance of the first and the second capacitors. Therefore, the capacitance can be greatly increased by the stacked capacitor comparing to the conventional capacitor when both of them occupy the same area.

According to the disclosure above, since the provided stacked capacitor is used, the capacitor occupied area can be largely reduced without sacrificing capacitance to meet the contradictory requirements for increasing the packing density and increasing the storage capacitance of the capacitor. Moreover, the manufacturing process of the provided structure of the stacked capacitor can be integrated in the available semiconductor processes.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative in features serving the same, equivalent or similar purpose, unless expressly stated otherwise. Thus, unless expressly stated otherwise, each feature disclosed is one example only of a generic series of equivalent or similar features.

What is claimed is:

1. A method of forming a stacked capacitor for double-poly flash memory, the method comprising:
    forming a lower electrode, wherein the lower electrode is a first doped region in a substrate and formed at the same step as a tunneling implant region of a flash cell is formed;
    forming a lower dielectric layer on the lower electrode, wherein the lower dielectric layer is formed at the same step as a tunneling oxide of the flash cell is formed;
    forming a central electrode on the lower dielectric layer, wherein the central electrode is formed at the same step as a floating gate of the flash cell is formed;
    forming an upper dielectric layer on the central electrode, wherein the upper dielectric layer is formed at the same step as a central dielectric layer of the flash cell is formed and covers a portion of the central electrode; and
    forming an upper electrode on the upper dielectric layer, wherein the upper electrode is formed at the same step as a control gate of the flash cell is formed.

2. The method of claim 1, further comprising forming a second doped region in the exposed portion of the first doped region.

3. The method of claim 1, wherein the lower dielectric layer is a thermal oxide layer or a high-k dielectric layer.

4. The method of claim 1, wherein the central electrode is a polysilicon layer or a conductive layer.

5. The method of claim 1, wherein the upper dielectric layer is an oxide-nitride-oxide composite layer or a high-k dielectric layer.

6. The method of claim 1, wherein the upper electrode is a polysilicon layer or a conductive layer.

7. A method of forming a stacked capacitor for double-poly flash memory, the method comprising:

forming a lower electrode, wherein the lower electrode is a first doped region in a substrate and formed at the same step as a tunneling implant region of a flash cell is formed;
sequentially forming a first dielectric layer and a first conductive layer on the substrate;
patterning the first dielectric layer and the first conductive layer at the same time, wherein the first dielectric layer is patterned to form a lower dielectric layer of the stacked capacitor and a tunneling dielectric layer of the flash cell, and wherein the first conductive layer is patterned to form a central electrode of the stacked capacitor and a floating gate of the flash cell;
sequentially forming a second dielectric layer and a second conductive layer on the substrate; and
pattering a second dielectric layer and the first conductive layer on the substrate at the same time, wherein the second dielectric layer is patterned to form an upper dielectric layer of the stacked capacitor and a central dielectric layer of the flash cell, and wherein the second conductive layer is patterned to form an upper electrode of the stacked capacitor and a control gate of the flash cell.

8. The method of claim 7, further comprising forming a second doped region in the exposed portion of the first doped region.

9. The method of claim 7, wherein the first dielectric layer is a thermal oxide layer or a high-k dielectric layer.

10. The method of claim 7, wherein the first conductive layer is a polysilicon layer or a conductive layer.

11. The method of claim 7, wherein the second dielectric layer is an oxide-nitride-oxide composite layer or a high-k dielectric layer.

12. The method of claim 7, wherein the second conductive layer is a polysilicon layer or a conductive layer.

* * * * *